United States Patent
Sworowski et al.

(10) Patent No.: US 11,946,741 B2
(45) Date of Patent: Apr. 2, 2024

(54) MEMS SENSOR FOR SENSING DEFORMATION BY BREAKING CONTACT BETWEEN TWO ELECTRODES

(71) Applicant: SILMACH, Besancon (FR)

(72) Inventors: Marc Sworowski, Caen (FR); Charles Haye, Devecey (FR)

(73) Assignee: SILMACH, Besancon (FR)

( * ) Notice: Subject to any disclaimer, the term of this patent is extended or adjusted under 35 U.S.C. 154(b) by 330 days.

(21) Appl. No.: 17/605,692

(22) PCT Filed: May 7, 2020

(86) PCT No.: PCT/EP2020/062733
§ 371 (c)(1),
(2) Date: Oct. 22, 2021

(87) PCT Pub. No.: WO2020/229303
PCT Pub. Date: Nov. 19, 2020

(65) Prior Publication Data
US 2022/0146247 A1    May 12, 2022

(30) Foreign Application Priority Data
May 10, 2019   (FR) ...................................... 1904884

(51) Int. Cl.
*G01B 7/00* (2006.01)
*B81B 3/00* (2006.01)
*G01B 7/16* (2006.01)

(52) U.S. Cl.
CPC .............. *G01B 7/18* (2013.01); *B81B 3/0086* (2013.01); *B81B 2201/02* (2013.01); *B81B 2203/04* (2013.01)

(58) Field of Classification Search
CPC .......... G01B 7/18; G01B 7/16; B81B 3/0086; B81B 2201/02; B81B 2203/04
See application file for complete search history.

(56) References Cited

U.S. PATENT DOCUMENTS 5,190,116 A * 3/1993 Reichow .............. G01G 19/083
                                                73/862.638
5,512,713 A * 4/1996 Naito ................... G01G 3/1412
                                                177/229
(Continued)

FOREIGN PATENT DOCUMENTS

CN    108020156 A  *  5/2018  ............... G01B 7/16
DE    19616506 C1    10/1997
(Continued)

OTHER PUBLICATIONS

International Search Report in related PCT Application No. PCT. EP2020/062733, dated Aug. 20, 2020.

*Primary Examiner* — Francis C Gray
(74) *Attorney, Agent, or Firm* — Thomas | Horstemeyer, LLP

(57) ABSTRACT

The present invention relates to a MEMS deformation sensor for measuring a relative movement between two regions of a structure, the sensor comprising: —a first portion (2) and a second portion (3) that are movable with respect to one another along a direction of measurement (X); —a thrust element (4) mounted fixed with respect to the first portion; —a first electrode (A) and a second electrode (B) that are capable of being raised to different electrical potentials, each mounted fixed with respect to the second portion; —a connecting portion (I) forming an electrical link between the first electrode and the second electrode, the thrust element applying a load to the connecting portion when the first portion moves with respect to the second portion along the direction of measurement beyond a predetermined distance, the electrical link being broken under the effect of the load.

17 Claims, 6 Drawing Sheets

(56) References Cited

U.S. PATENT DOCUMENTS

| | | | | |
|---|---|---|---|---|
| 2009/0301215 A1* | 12/2009 | McDearmon | ............ | G01B 7/16 |
| | | | | 73/774 |
| 2015/0091911 A1* | 4/2015 | de Groot | .................. | B81B 5/00 |
| | | | | 359/230 |
| 2020/0150417 A1* | 5/2020 | Kiuchi | ...................... | F03G 7/06 |
| 2021/0095949 A1* | 4/2021 | Gattere | ................ | H03K 17/975 |

FOREIGN PATENT DOCUMENTS

| | | |
|---|---|---|
| FR | 2418441 A1 | 9/1979 |
| FR | 2703768 A1 | 10/1994 |
| FR | 2728677 B1 | 3/1997 |
| WO | 2007045997 A2 | 4/2007 |

\* cited by examiner

MEMS SENSOR FOR SENSING DEFORMATION BY BREAKING CONTACT BETWEEN TWO ELECTRODES

CROSS REFERENCE TO RELATED APPLICATIONS

This application is the 35 U.S.C. § 371 national stage application of PCT Application No. PCT/EP2020/062733, filed May 7, 2020, which application claims the benefit of French Application No. FR 1904884, filed May 10, 2019, both of which are hereby incorporated by reference herein in their entireties.

FIELD OF THE INVENTION

The present invention lies in the technical field of MEMS (Micro Electro-Mechanical Systems) type micro-sensors. The invention more particularly relates to a MEMS type deformation sensor and to an electronic circuit integrating such a sensor.

STATE OF THE ART

Many electronic systems integrate MEMS micro-sensors for the real-time detection of displacements along one or more directions. For example, shock sensors can be integrated into a system intended to be subjected to vibrations during its use, to measure a displacement exceeding a threshold. A MEMS type sensor allows the detection of a displacement of the system on a microscopic scale, and is therefore capable of reporting a shock invisible to the naked eye.

Several existing MEMS deformation sensors comprise two mechanical elements, one of the two elements being configured to translate relative to the other element and mechanically urge the latter in case of displacement of the system in a given direction.

By way of example, the international application published under the number WO 2017/149211 A1 describes a sensor comprising a pushing part movable relative to a detection assembly, the detection assembly comprising an actuation beam located on the stroke of the pushing part. In case of displacement of the support of the pushing part along a direction of measurement in the way of approximation with the actuation beam, the pushing part deforms the parallelogram formed by the actuation beam and by connection beams of the detection assembly, and the actuation beam is moved in the direction of a fixed tooth located oppositely.

In this MEMS sensor of the prior art, the local event allowing the detection of deformation is the mechanical displacement of the actuation beam coming closer to the facing fixed tooth.

Other active-type MEMS deformation sensors operating under power supply are known, in which a deformation is detected when an electrical contact is established between deformable elements which are not very distant and which are brought to different potentials.

According to one example, said deformable elements are parallel deformable beams which are slightly spaced axially from each other. A pushing part, movable along a direction substantially perpendicular to the two beams at rest, is positioned facing the two beams.

When the sensor is supplied with electrical energy, the two beams are placed at different electric potentials. When the support of the pushing part undergoes a displacement in the direction of mobility of the pushing part over a distance greater than or equal to a threshold distance, the pushing part drives one of the two beams against the other beam. The two beams are then in mechanical contact; if the pressure exerted by the pushing part at the contact area is sufficient, an electrical voltage is established between the two beams.

One disadvantage of this type of active deformation sensors is that there is a range of uncertainty over the distance of displacement of the pushing part from which the electrical contact is established between the two beams. The gap between the two beams, along the direction of mobility of the pushing part, is dimensioned so that the mechanical contact is created precisely from the threshold distance. However, the beams are flexible and have deformability along the direction of mobility of the pushing part. Thus, the pushing part can move by a distance greater than the threshold in case of deformation, the two beams thus coming into mechanical contact, without the pressing force of one beam against the other being sufficient to generate a low-resistance electrical contact.

In the latter case, the approximation of the two beams is detected only for a certain distance of displacement of the pushing part strictly greater than the threshold distance. A displacement of the pushing part over a distance equal to or barely greater than the threshold distance may not be detected. The detection of deformation is therefore flawed by inaccuracy which is not acceptable for some applications.

The range of uncertainty over the distance of displacement of the pushing part can be reduced by increasing the rigidity of the beams in the direction of mobility of the pushing part. However, it remains necessary that the deformable beams remain sufficiently flexible in the direction of mobility to authorize a subsequent displacement of the pushing part in the way of approximation of the two beams, after putting the two beams into mechanical contact.

GENERAL DESCRIPTION OF THE INVENTION

There is therefore a need for a MEMS deformation sensor operating by detection of a change in the electrical resistance at movable electrodes, having an improved detection accuracy.

In particular, the change in electrical resistance between the movable elements must correspond very accurately to the exceeding of a predetermined deformation threshold.

There is an additional need for a MEMS deformation sensor compatible with an intermittent power supply. The detection of an event where the deformation threshold is exceeded must not be compromised by an absence or a power supply cutoff in the sensor.

Secondarily and for some specific applications, there is a desire for a MEMS deformation sensor which allows such mechanical-type storage of an event where the deformation threshold is exceeded, while being reusable for detecting subsequent deformation events. For other specific applications, there is desire for a deformation sensor configured to definitively adopt a displaced position after an event where the threshold is exceeded, the sensor then being tamper-proof.

To meet these needs, the invention relates, according to a first aspect, to a MEMS type deformation sensor, the sensor being adapted to measure a relative displacement between two areas of a structure, the sensor comprising:
    a first part and a second part being movable relative to each other along a direction of measurement,
    a pushing element fixedly mounted relative to the first part, a first electrode and a second electrode being adapted to be brought to different electric potentials, each electrode being fixedly mounted relative to the second part, a junction part forming an electrical connection between the first electrode and the second electrode, the pushing element being configured to exert a load on the junction part when the first part moves relative to the second part along the direction of measurement beyond a predetermined distance, the electrical connection being broken under the effect of the load.

With the MEMS deformation sensor of the invention, the exceeding of a predetermined deformation threshold—corresponding to a displacement of the first part carrying the pushing element relative to the second part beyond the predetermined distance—is detected thanks to the breaking of the electrical connection between the two electrodes. The breaking of this electrical connection can be detected by a measuring system subsequently to the deformation event, during an interrogation of the state of the sensor by a remote system. Alternatively, the breaking of the electrical connection can be detected in real time by the measuring system configured to transmit this information to the remote system. Such a measuring system can be a microcontroller measuring an electric potential at one of the two electrodes.

It is not necessary that the junction part is deformable at its area of contact with the pushing element, unlike the sensors of the state of the art operating by putting the electrodes into electrical contact during the deformation event. Thus, when the junction part is loaded by the pushing element, the electrical connection is clearly broken. The breaking of the electrical connection corresponds more specifically to the predetermined distance of displacement of the pushing element for which the sensor has been dimensioned, compared to the MEMS sensors of the prior art where the breaking of the electrical connection can occur for a distance of displacement further from the value for which the sensor was dimensioned.

The detection of exceeding of the deformation threshold by breaking of the electrical connection, caused by the push against the electrical junction part, therefore has the advantage of minimizing the range of uncertainty around the deformation threshold. The deformation sensor of the invention thus has better detection accuracy.

Another advantage of the sensor of the invention is that it does not necessary prevent a subsequent displacement of the pushing element, along the direction of measurement and in the same way of measurement, beyond the predetermined distance of displacement. Indeed, the sensor of the invention does not require a direct approximation of two electrodes against each other. The stroke of the pushing element is therefore not necessarily limited and can continue once a deformation event has occurred.

The deformation sensor as defined above may further comprise the following non-limiting features, taken alone or in any one of the technically possible combinations.

the pushing element is configured to exert the load on the junction part when the first part moves relative to the second part along a first way, and not to exert any load on the junction part when the first part moves relative to the second part in a second way, opposite to the first way, along the direction of measurement.

the junction part comprises a first bridge and a second bridge, the first bridge and the second bridge being respectively fixed to the first electrode and to the second electrode, the load of the pushing element on the junction part having the effect of breaking the first bridge and the second bridge.

in the latter case, the first bridge and the second bridge are formed by thinned portions of the junction part.

the junction part comprises a deformable element, the deformable element being designed to be deformed between an open configuration and a closed configuration, the junction part electrically linking together the first electrode and the second electrode when the deformable element is in the closed configuration, the pushing element being designed to load the deformable element from the open configuration towards the closed configuration when the first part moves relative to the second part along the direction of measurement.

in the latter case, the deformable element includes a first end fixed to the second electrode and a second end designed to be moved relative to the second electrode during a deformation of the deformable element.

the deformable element has a first rigidity in the vicinity of the first end and has a second rigidity in the vicinity of the second end, the first rigidity being strictly lower than the second rigidity.

the sensor comprises an abutment arranged to authorize a relative displacement of the pushing element in a first way towards the deformable element until the pushing element loads the deformable element, and to prevent a subsequent displacement of the pushing element in a second way, opposite to the first way.

in the latter case, the sensor comprises an arm including a termination, the pushing element comprising a locking element extending from the termination along a direction substantially parallel to the direction of measurement, the locking element being configured to cooperate with the abutment.

the abutment protrudes from the second electrode towards the pushing element.

the abutment comprises a sliding surface and a blocking surface, the sliding surface being oriented so that when the pushing element moves in a first way, towards the deformable element, the pushing element slides on the sliding surface, and the blocking surface being oriented so that when the pushing element subsequently moves in a second way, opposite to the first way, while moving away from the deformable element, the pushing element comes into abutment against the blocking surface.

the second part comprises a silicon-on-insulator type substrate, also called SOI, the first electrode and the second electrode being carried by the substrate.

The invention relates, according to a second aspect, to an electronic circuit comprising a MEMS deformation sensor as defined above.

Advantageously and without limitation, said circuit can have the following characteristics taken alone or in combination.

the circuit further comprises a conductor configured to be brought to a fixed potential, a resistance comprising a first terminal and a second terminal, the first terminal being connected to the conductor, the second terminal being connected to the first electrode of the deformation sensor or to the second electrode of the deformation sensor, and a voltage measuring device, said device being configured to provide a measurement of the potential of the second terminal.

the circuit further comprises an unlocking system which comprises an actuator configured to exert, on command, a force able to push back the pushing element relative to the abutment, preferably an electrostatic or magnetic force.

According to a third aspect, the invention relates to a MEMS type deformation sensor, the sensor being adapted to measure a relative displacement between two areas of a structure, the sensor comprising:
- a first part and a second part being movable relative to each other along a direction of measurement,
- a pushing element fixedly mounted relative to the first part,
- a first electrode and a second electrode being adapted to be brought to different electric potentials, each electrode being fixedly mounted relative to the second part,
- a junction part comprising a deformable element, the deformable element having an open position and a closed position, the junction part forming an electrical connection between the first electrode and the second electrode when the deformable element is in the closed position, the pushing element being configured to load the deformable element from one of the open or closed positions towards the other of the open or closed positions when the first part moves relative to the second part along the direction of measurement,
- an abutment arranged to authorize a relative displacement of the pushing element towards the deformable element in a first way until the pushing element loads the deformable element, and to prevent a subsequent displacement of the pushing element in a second way, opposite to the first way.

The deformation sensor as defined according to this third aspect can further comprise the following non-limiting characteristics, taken alone or in any one of the technically possible combinations:
- the deformable element includes a first end fixed to the second electrode and a second end designed to be moved relative to the second electrode during a deformation of the deformable element.
- in the latter case, the deformable element has a first rigidity in the vicinity of the first end and has a second rigidity in the vicinity of the second end, the first rigidity being strictly lower than the second rigidity.
- the sensor comprises an arm including a termination, the pushing element comprising a locking element extending from the termination along a direction substantially parallel to the direction of measurement, the locking element being configured to cooperate with the abutment.
- the abutment protrudes from the second electrode in the direction of the locking element.
- the abutment comprises a sliding surface and a blocking surface, the sliding surface being oriented so that when the pushing element moves in a first way, towards the deformable element, the pushing element slides on the sliding surface, and the blocking surface being oriented such that when the pushing element subsequently moves in a second way, opposite to the first away, while moving away from the deformable element, the pushing element comes into abutment against the blocking surface.

The invention relates, according to a fourth aspect, to an electronic circuit comprising a MEMS deformation sensor as defined according to the third aspect.

This circuit can have, in an advantageous and non-limiting manner, the following characteristics:
- the circuit further comprises a conductor configured to be brought to a fixed potential, a resistance comprising a first terminal and a second terminal, the first terminal being connected to the conductor, the second terminal being connected to the first electrode of the deformation sensor or to the second electrode of the deformation sensor, and a voltage measuring device, said device being configured to provide a measurement of the potential of the second terminal.
- the circuit further comprises an unlocking system which comprises an actuator configured to exert, on command, a force able to push back the pushing element relative to the abutment, preferably an electrostatic or magnetic force.

GENERAL DESCRIPTION OF THE FIGURES

Other characteristics, aims and advantages of the invention will emerge from the following description which is purely illustrative and not limiting and which should be read in relation to the appended drawings among which:

FIG. 1a schematically represents a circuit according to one embodiment comprising a deformation sensor, the movable parts of the sensor being in a rest position;

FIG. 1b schematically represents the circuit of FIG. 1a, the movable parts of the sensor being in a loaded position of the junction part, different from the rest position;

DETAILED DESCRIPTION OF EMBODIMENTS

In all of the figures and in the detailed description below, similar elements bear identical alphanumeric references.

Circuit Integrating an Active Deformation Sensor—General Architecture

Figure 1A:
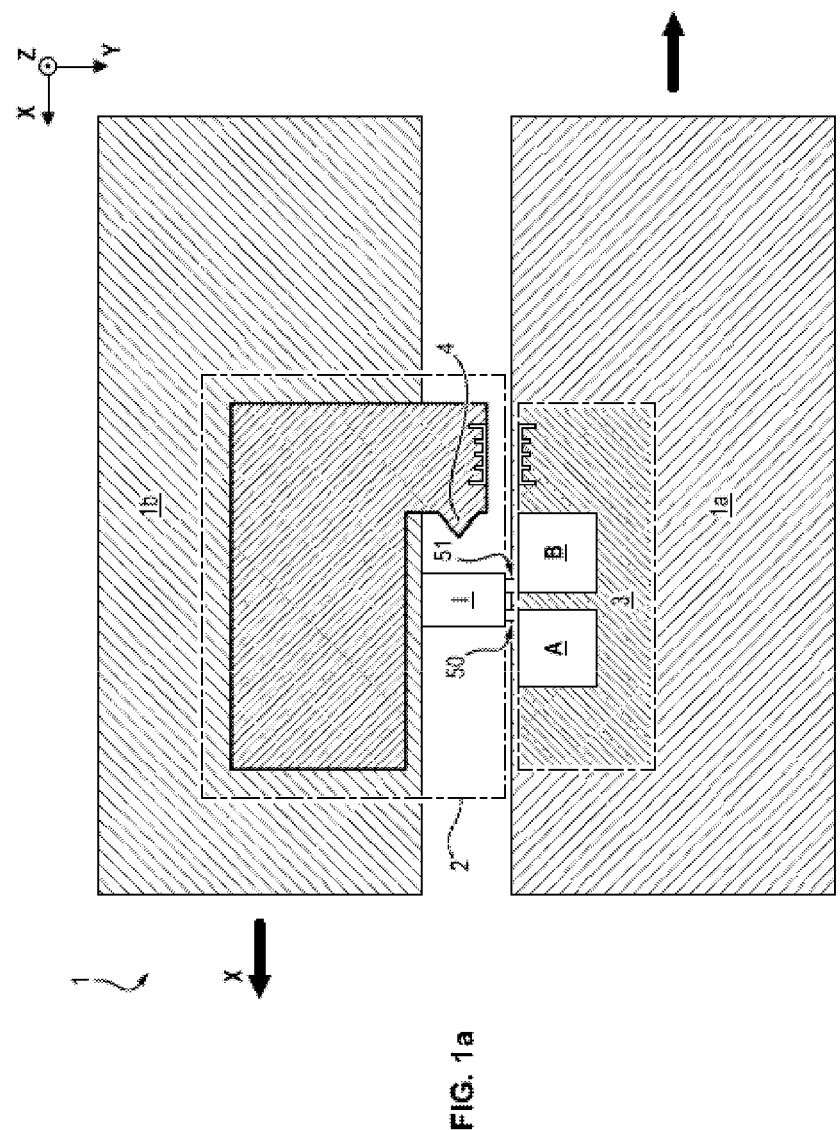
Figure 1B:
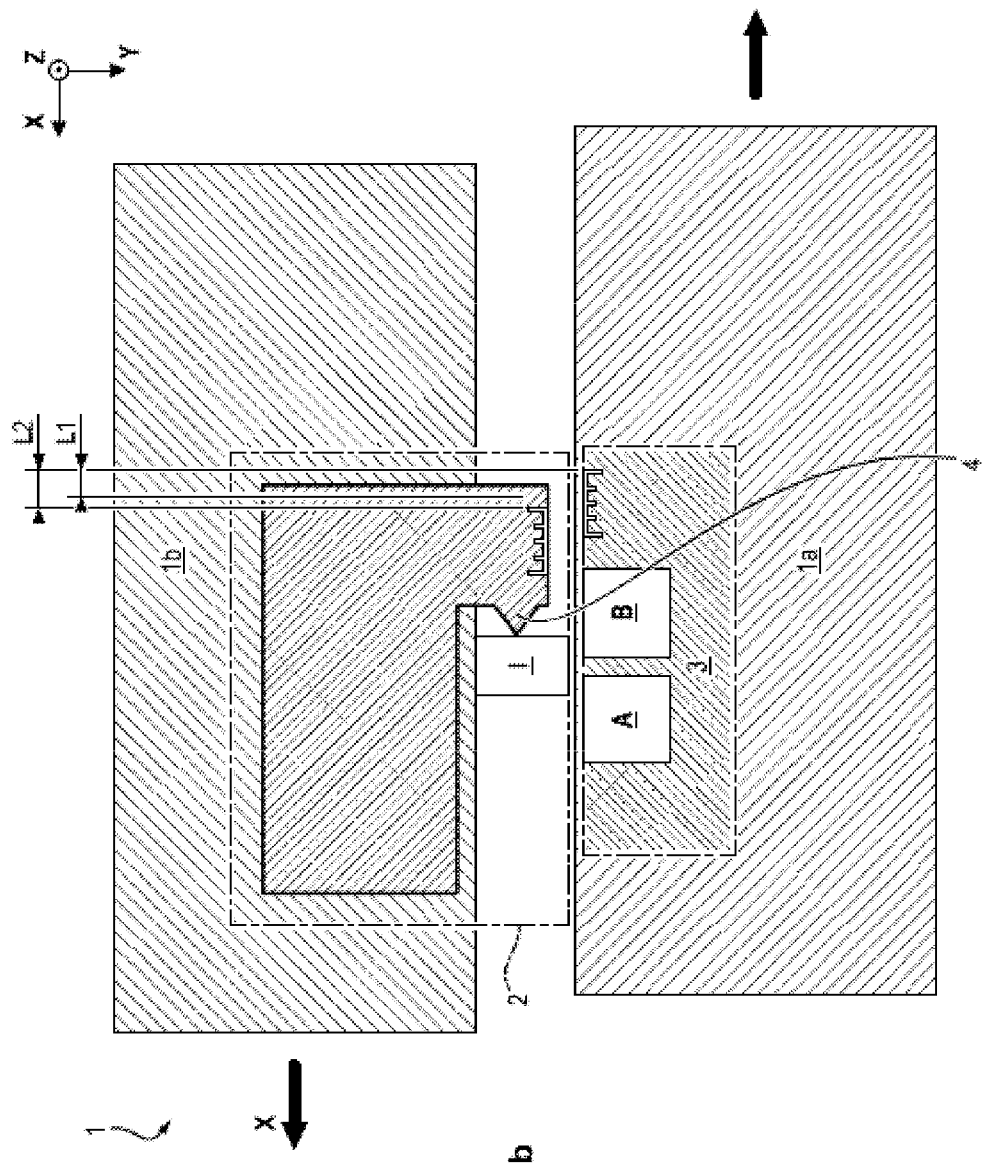

FIGS. 1a and 1b represent a MEMS (Micro Electro-Mechanical System) type sensor embedded in an electronic circuit 1. The circuit 1 comprises a top mechanical support 1a and a bottom mechanical support 1b. FIGS. 1a and 1b correspond respectively to a rest position and a loaded position of a junction part I of the sensor.

The proposed sensor forms a device for detecting a deformation of a structure on which the electronic circuit 1 is embedded.

In the following, "deformation event" will be understood as a deformation felt at the sensor, resulting in a relative displacement of the two supports 1a and 1b.

It will be understood that the terms "top" and "bottom", to denote the top mechanical support 1a and the bottom mechanical support 1b, are valid for the orientation illustrated in FIGS. 1a and 1b. In operation, the two supports can be positioned along other orientations. FIGS. 1a and 1b represent a three-dimensional reference frame (X, Y, Z); the sensor is here configured to detect a translation of the support 1a relative to the support 1b along the direction of measurement X, in the way of a displacement of the support 1a towards the left relative to the support 1b.

The mechanical supports 1a and 1b respectively serve as supports for a first movable part 2 and a second movable part 3 of the sensor. Thus, the first part 2 is secured to the support 1a and the second part 3 is secured to the support 1b. The movable parts 2 and 3 carry the elements useful for the detection of deformation.

The proposed sensor is here an active-type MEMS sensor, intended to operate with a power supply (not represented) upon interrogation of the sensor. The power supply to the sensor may be intermittent, that is to say, it is not necessary for the sensor to be supplied with electric current during the occurrence of the deformation event; if the sensor is subsequently supplied with electrical energy, when interrogating the sensor, it will be possible to detect that the deformation event has taken place.

The second part 3 includes a substrate on which the electrodes A and B are mounted. The material(s) of the substrate are chosen with rigidity, crystallinity and a resistivity in accordance with a use within a MEMS sensor. The resistivity of the material(s) can be reduced with a specific surface treatment such as metallization, for example by gold deposition. In addition, the substrate must be compatible with the usual micro-manufacturing methods. Preferably, said substrate is a silicon-on-insulator type substrate, also called SOI.

In addition, the substrate is made so as to allow resumption of electrical contact at the electrodes A and B.

The first part 2 supports a pushing element 4, fixed relative to the first part 2. The second part 3 comprises two electrodes A and B intended to be brought respectively to a first potential and to a second potential when the sensor is supplied, the two potentials being different.

The second part 3 also includes a junction part I. At rest (before the pushing element 4 load), the junction part I is fixedly mounted relative to the second part 3, in particular in translation along the X direction, and this junction part achieves an electrical connection between the first electrode A and the second electrode B. The electrodes A and B preferably don't have any other electrical connection therebetween except the junction part I.

In the example of FIG. 1*a*, the junction part I comprises a first bridge 50 and a second bridge 51. Preferably, the junction part I is made of the same material as the substrate of the second part 3, for example a silicon-on-insulator type material. The substrate is of low resistivity or is made conductive by metallization. The junction part is fixed on the first electrode A by the bridge 50 and fixed on the second electrode B by the bridge 51.

In the example of FIGS. 1*a* and 1*b*, the first part 2 comprises a portion extending towards the second part 3 and said portion carries the pushing element 4. The pushing element extends along the X direction, here pointed. The junction part I extends in the direction of the first part 2, facing the pushing element 4.

A deformation sequence of the sensor can proceed as follows.

In the rest position of FIG. 1*a*, for example in the unloaded state of a structure comprising the sensor, the pushing element 4 is located at a distance from the junction part I.

According to a first possibility, the sensor is not supplied with electrical energy during the deformation event during the sequence described below. Indeed, as will be seen below, the proposed MEMS sensor has the advantage of allowing the detection of a deformation event exceeding a predetermined threshold, even if this event occurs in the absence of power supply to the sensor. During a subsequent interrogation of the state of the sensor by a remote system, the sensor is on the other hand supplied with electrical energy in order to allow a measurement by a measurement system, and the two electrodes A and B are brought to different potentials. The subsequent interrogation of the sensor allows observing a posteriori the occurrence of a deformation event.

According to a second possibility, the sensor is supplied with electrical energy during the deformation event during the sequence described below.

During a mechanical load on the sensor, for example in case of shock or vibratory event undergone by the sensor, the first part 2 can move relative to the second part 3 along the direction of measurement X, in such a way the pushing element 4 and of the junction part I come closer to each other.

The junction part I thus follows the second part 3 at the beginning of the approximation displacement, up to a relative distance of displacement along the X direction smaller than the distance identified in FIG. 1*b* by the reference L1. The distance of displacement L1 is preferably comprised between 5 and 500 micrometers, and even more preferably between 10 and 200 micrometers.

If the relative displacement continues beyond the distance of displacement L1, for example up to the distance of displacement L2 here, the pushing element 4 exerts a load on the junction part I.

Under the effect of the load, the electrical connection is broken at the junction part I.

FIG. 1*b* thus corresponds to a loaded position of the junction part.

The distance L1 constitutes a relative displacement threshold of the parts 2 and 3, beyond which there is a breaking in the electrical connection between the electrodes A and B. The electrical breaking is for example detected by means of a measurement of potential at one of the two electrodes.

The measurement of potential at one of the two electrodes allows, as will be seen below, measuring an equivalent resistance between the two electrodes A and B. An impedance value associated with this equivalent resistance differs depending on the existence or not of an electrical connection between the electrodes A and B passing through the junction part I.

Thus, thanks to the proposed sensor, a deformation exceeding a predetermined threshold corresponding to the distance of displacement L1 can be detected in real time.

One advantage of this sensor is that the range of inaccuracy of the detection of the distance of displacement L1 is greatly reduced compared to the existing sensors. In other words, a relative displacement equal to or barely greater than the distance L1, for which the sensor has been calibrated, indeed leads to the detection of a breaking in the electrical connection between the electrodes A and B. The detection of deformation is therefore very accurate.

The Applicant has observed that for a distance of displacement L1 between 10 and 200 micrometers, the range of uncertainty around the distance L1 for the breaking of the electrical connection between A and B can be made smaller than more or less 1 micrometer.

The proposed sensor constitutes a simple system for the detection of deformation. It requires only usual components in the field of microelectronics.

The sensor can for example be obtained from a silicon-type substrate, for example a silicon-on-insulator substrate, with a structuring of the parts 2 and 3 comprising the pushing part and the electrodes (for example by etching) and a metallization of the conductive tracks to obtain a good-quality electrical contact between the electrodes A and B. These operations allow a manufacture of several sensors per matrix (or wafer). A very satisfactory unit price/accuracy ratio is then obtained for the manufacture of the sensors.

It will be noted that the pushing element 4 is here configured to exert the load on the junction part I when the first part moves to the left relative to the second part along the X direction, and so as not to exert any load on the junction part I when the first part moves to the right relative to the second part along the X direction. A sensor configured to specifically detect a relative displacement of the supports 1a and 1b in a way of approximation along the X direction is therefore obtained.

In the specific example of FIG. 1b, the load exerted by the pushing element 4 is a pressing force on the junction part, sufficient to cause a breaking of the first bridge 50 and of the second bridge 51. After this breaking, there is no longer any mechanical connection between the electrodes and the junction part, and the junction part is no longer fixed to the second part 3.

The range of inaccuracy of the displacement detection can be further reduced by using a junction part I whose area of contact with the pushing element 4 is not deformable along the X direction. Indeed, in this case, the junction part I does not deform on contact with the pushing element and the breaking in the electrical connection between the electrodes A and B is clear.

According to one possible variant, the pushing element can be associated with two predetermined deformation thresholds for two opposite ways of displacement along the same direction of deformation. For example, the pushing element can be interposed along the X direction between two junction parts of similar structure, corresponding to two different electrical connections between pairs of different electrodes (possibly having one electrode in common). When the pushing element approaches one of the two junction parts beyond the deformation threshold, the electrical connection corresponding to said junction part is broken.

One advantage of this variant is that it allows the detection of deformation events along different ways of relative displacement, with independent predetermined deformation thresholds. Said thresholds may be the identical or different.

According to another variant, which may or may not be associated with the previous variant, the same way of relative displacement along the same X direction may correspond to several different junction parts, and therefore to several different predetermined deformation thresholds. The same pushing element 4 can carry several different end parts which are configured to interact with several different junction parts. The different junction parts correspond to electrical connections between pairs of different electrodes.

In the latter variant, the successive crossing of the different deformation thresholds by the pushing element allows accurately estimating the relative distance of displacement of the part carrying the pushing element, relative to the part carrying the different junction parts.

The sensor of the invention is therefore adaptable according to the desired application: measurement of several deformation thresholds along the same way of measurement and/or along two different ways of measurement carried by the same direction of measurement.

Pushing Element and Junction Part of the Electrodes According to an Example 1

Figure 2:
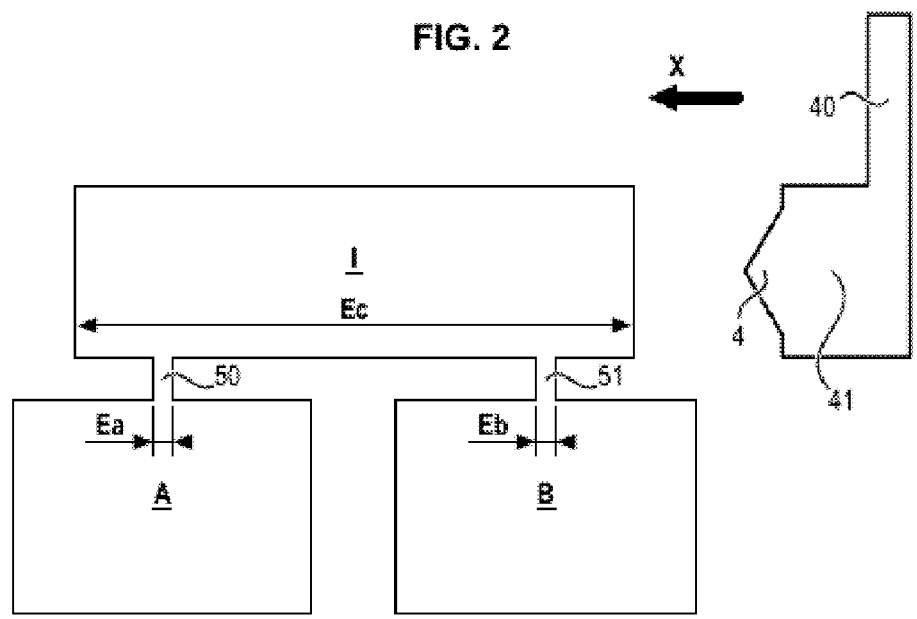
FIG. 2 is a diagram illustrating elements of a deformation sensor according to a first variant.

FIG. 2 is a close-up schematic view of some elements of a deformation sensor in accordance with the general architecture above, according to a first embodiment. This embodiment is similar to the example represented in FIGS. 1a and 1b.

In this embodiment, the junction part I is formed of a block 54 linked to the electrode A by a first bridge 50 and linked to the electrode B by a second bridge 51. For example, the block 54 has a parallelepiped shape. The bridges 50 and 51 are made of a conductive material. The material of the bridges 50 and 51 has for example been made conductive by metallization, for example by gold deposition. Thus, the bridges 50 and 51 achieve an electrical and mechanical connection between the junction part I and, respectively, the electrode A and the electrode B. The electrodes A and B are here distant from each other.

The first bridge 50 and the second bridge 51 are areas of weakness of the junction part, having a lower breaking strength compared to the rest of the junction part. Preferably, the first bridge 50 and the second bridge 51 are formed by thinned portions of the junction part I. In the example of FIG. 2, the junction part has, at the first bridge 50, the second bridge 51 and the block 54, respective thicknesses Ea, Eb and Ec along the X direction. The thicknesses Ea and Eb are very small compared to the thickness Ec, preferably less than 20% thereof. Here, each of the thicknesses Ea and Eb is less than 10% of the thickness Ec.

Alternatively, a single bridge can be produced between the junction part I and the pair of electrodes A and B. Indeed, if the electrodes A and B are sufficiently close along the X direction, a single thin bridge can be produced to link the two electrodes to the junction part, while remaining a preferential breaking area at this thin bridge during the load of the pushing element 4.

The pushing element 4 here comprises an end part which extends towards the junction part I along the X direction. Optionally, the pushing element 4 comprises an arm 40 which extends from the first movable part 2 (not represented) of the sensor towards the second part 3, or which is fixedly mounted on said first movable part 2, the arm 40 including a termination 41 from which the end part of the pushing element 4 protrudes.

In the variant where the pushing element is comprised between two junction parts, and is associated with two deformation thresholds for two opposite ways of displacement along the same direction of deformation, the pushing element can comprise two end parts protruding from the termination 41 in the two opposite ways.

In this first embodiment, when the first part 2 moves along the X direction relative to the second part 3 in a way of approximation, beyond the distance of displacement L1, the pushing element 4 comes into contact with an outer surface of the block 54 and exerts a sufficient pressing force on the block 54 to break the first bridge 50 and the second bridge 51.

After this breaking (or even in case of breaking of only one of the two bridges), the electrical connection between the electrodes A and B passing through the junction part I is broken.

One advantage of using a sensor in which the deformation event results in a breaking in the electrical connection between the electrodes A and B is, as indicated above in relation to FIGS. 1a and 1b, to avoid a range of uncertainty around the displacement threshold of the pushing part.

The junction part I, with the two bridges 50 and 51, here constitutes a mechanical fuse part. This fusible part is intended to break as a result of a deformation event which generates a displacement of the pushing element relative to the junction part greater than the distance L1.

The breaking of any one of the two bridges 50 and 51 is irreversible. Thus, after a deformation event causing a relative displacement beyond the distance of displacement L1, the junction part I is definitively separated from the two electrodes A and B, which are therefore no longer electrically linked to each other.

One advantage of the irreversibility of the breaking is that, during a period when the power supply to the sensor is momentarily cut off during or after the deformation event, the junction part I remains separated from the electrodes A and B. When the power supply is recovered, the mechanical fuse is still broken. It is therefore still possible to interrogate the sensor and to observe that the sensor has undergone a deformation event.

The sensor according to this first embodiment is thus compatible with an intermittent power supply.

Pushing Element and Junction Part of the Electrodes According to an Example 2

Figure 3A:
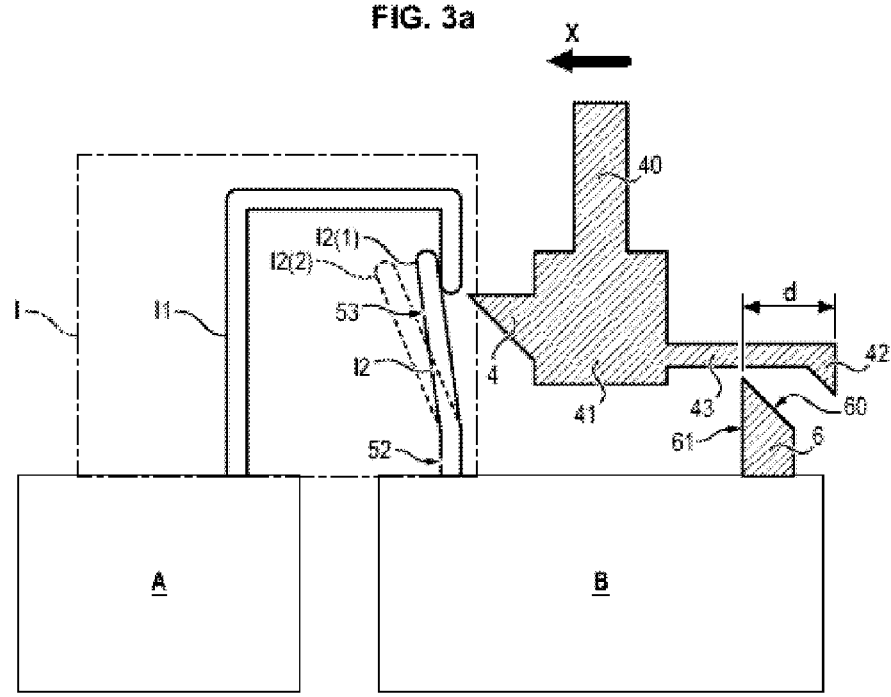
FIG. 3a is a diagram illustrating elements of a deformation sensor according to a second variant.

FIG. 3a represents some elements of a deformation sensor in accordance with the general architecture above, according to a second embodiment.

The overall architecture of the sensor is identical to the foregoing. The pushing element 4 remains fixed relative to the first part 2. In the rest position, the junction part remains fixed relative to the second part 3. However, the junction part I of this second embodiment has a structure different from that of the junction part of the first embodiment.

Here, the junction part I comprises an element i1 for connection with one of the electrodes, for example the electrode A. The junction part I further comprises a deformable element i2 achieving (in the rest position) an electrical contact between the junction part I and the other of the electrodes, for example the electrode B. The deformable element i2 can switch between an open position represented in dotted line as i2(2) in FIG. 3a and a closed position represented in solid line as i2(1) in FIG. 3a. The connection element i1 is rigid and preferably has rigidity greater than that of a bottom end of the deformable element i2.

In the closed position of the element i1, an electrical connection between the electrode B and the connection element i1 passes through the deformable element i2. Since the connection element i1 is conductive, the electrodes A and B are electrically linked in this closed position.

In the open position of the element i1, there is no electrical connection passing through the element i2 between the electrode B and the element i1.

The pushing element 4 is configured to load the deformable element i2 from the closed position towards the open position when the first part 2 moves relative to the second part 3 along the X direction of measurement beyond the threshold distance L1. The closed position of the element i2 corresponds, in this second embodiment, to a rest position of the junction part I, and the open position of the deformable element i2 corresponds to a loaded position of the junction part I.

Here again, the pushing element 4 is positioned relative to the junction part I (in particular relative to the deformable element i2) so that, for a displacement greater than the distance L1 of the first part 2 relative to the second part 3 along the X direction in a way of approximation, the pushing element 4 comes into contact with the deformable element i2 and causes its switching to the open position, thus breaking the electrical connection between the two electrodes A and B.

The junction part I is arranged so that the deformable element i2 is not blocked by an obstacle on the side opposite that of the pushing element.

Advantageously, the deformable element comprises a bottom end fixed to the electrode B and a top end movable relative to the electrode B along the X direction. The top end is a free end.

In the example of FIG. 3a, the connection element i1 is a rigid element fixed relative to the second part 3. The element i1 comprises a hook oriented downwards. The deformable element i2 rests, in its closed position i2(1), on the free end of the hook, the hook extending between the deformable element i2 and the pushing element 4.

Thus, the deformable element i2 switches to the open position upon contact, and a breaking in the electrical connection between the electrodes A and B is immediately detected. The detection of deformation precisely corresponds to the distance L1 of displacement.

One advantage of using a sensor in which the deformation event results in a breaking in the electrical connection between the electrodes A and B is, as indicated above in relation to FIGS. 1a and 1b, to avoid a range of uncertainty around the displacement threshold of the pushing part.

It will be noted that an intermediate position of the deformable element located between the open position i2(2) and the closed position i2(1) also corresponds to a breaking in the electrical contact between the electrodes A and B.

Advantageously, the deformable element i2 has rigidity in the vicinity of the top end 53 which is strictly greater than its rigidity in the vicinity of the bottom end 52. The bottom end 52 is flexible. The top end 53 is, for its part, sufficiently rigid so that the electrical connection is broken upon contact with the pushing element 4. One advantage of this configuration is that the deformable element i2 switches to the open position as soon as the pushing element 4 begins to press on the top end 53 of the deformable element i2.

Very advantageously, the sensor according to the second embodiment of FIG. 3a further comprises a system for locking the deformable element i2. The locking system here allows locking the deformable element i2 in the open position after a deformation event.

The sensor thus comprises an abutment 6, making it possible to maintain the pushing element 4 in a position where it loads the deformable element i2 in the open position, even after the deformation event which brought the deformable element i2 into the open position.

In the example of FIG. 3a, the abutment 6 has the shape of a pad protruding from the electrode B, towards the pushing element 4. The abutment 6 is secured to the second part 3 to which the electrode B is fixed. The pushing element 4 is here arranged on a termination 41 of an arm 40. To ensure the cooperation between the pushing element 4 and the abutment 6, the pushing element comprises a locking element 42 which extends along the X direction, on the side opposite to that of the deformable element i2.

The locking element 42 is here a triangular tip placed at the end of a pole 43. The pole 43 extends from the termination 41 along the X direction in a way of remoteness from the deformable element i2.

The abutment 6 is arranged to authorize a relative displacement of the pushing element 4 towards the deformable element i2 along the X direction until the pushing element loads the deformable element in the open position during a deformation event: the tip of the abutment 6 is here distant from the tip 42 by a distance d greater than L1 in the rest position.

The abutment 6 is arranged to prevent a subsequent displacement of the pushing element 4 in a way of remoteness from the deformable element i2, after the occurrence of a deformation event which generates a contact with the deformable element i2.

In other words, the abutment 6 prevents the pushing element 4 from returning to a position away from the deformable element which would have the effect of re-establishing the electrical connection between the two electrodes A and B, after the deformation event.

Here, when the pushing element is moved towards the deformable element i2 by a distance greater than the distance d illustrated in FIG. 3a, the tip 42 is first put into contact with the abutment 6, then moves past said abutment.

Once the tip 42 has moved past the abutment 6 (to the left of the abutment in FIG. 3a), the tip 42 cannot move back to the other side of the abutment.

Thus, once the distance d has been crossed, the deformable element i2 remains loaded in a broken position of the electrical connection between the electrodes A and B.

Thanks to the locking system, if the power supply to the sensor is momentarily cut off during or after a deformation event causing a relative displacement beyond the distance of displacement L1, the pushing element remains prevented by the abutment 6 from returning to its rest position. Here, the pushing element remains prevented from moving to the right. When the power supply is recovered, it is therefore still possible to observe that the sensor has undergone a deformation event.

The cooperation between the pushing element and the abutment thus ensures the compatibility of the deformation sensor with an intermittent power supply.

In the example of FIG. 3a, the abutment 6 comprises a sliding surface 60 and a blocking surface 61.

The sliding surface 60 is oriented so that when the pushing element 4 moves toward the deformable element i2 along the X direction, the pushing element slides on the sliding surface. Here, the sliding surface 60 has a slope complementary with a slope of the tip 42.

On the other hand, the blocking surface 61 is oriented so that when the pushing element 4 subsequently moves in a way of remoteness from the deformable element along the X direction, the pushing element 4 comes into abutment against the blocking surface 61. Here, the blocking surface 61 extends along a direction orthogonal to the X direction. Thus, the tip 42 abuts against the blocking surface 61 during a displacement towards the right from the left of the abutment 6.

This mechanical configuration is advantageous because it allows maintaining the deformable element i2 in a broken position of the electrical connection, without preventing subsequent displacements of the pushing element 4 towards the deformable element i2.

Advantageously, an electronic circuit comprising the deformation sensor of the example of FIG. 3a further comprises an unlocking system (not represented here), configured to load the pushing element or the abutment so that the pushing element is no longer limited by the abutment.

For example, the circuit comprises a MEMS technology actuator configured to exert, on command, a force able to push back the pushing element 4 relative to the abutment 6. It can be an actuator configured to move the tip 42 or the pole 43 upwards, which frees the tip 42 and allows a displacement of the pushing element 4 to the right, even following a deformation event.

The actuator operates for example by mechanical, electrostatic or magnetic cooperation with the tip 42 or the pole 43. It is typically a remote electrically controllable actuator.

Such an unlocking system is advantageous in combination with the locking element 42 and the abutment 6, because it allows unlocking, on command, the pushing element to allow it to return to its initial state before the deformation event.

The proposed sensor becomes, with the unlocking system, a sensor resettable on command. The compatibility of the sensor with intermittent power supply is observed, with the sensor only reset if a signal is transmitted to the actuator of the unlocking system to unlock the pushing element.

Figure 3B:
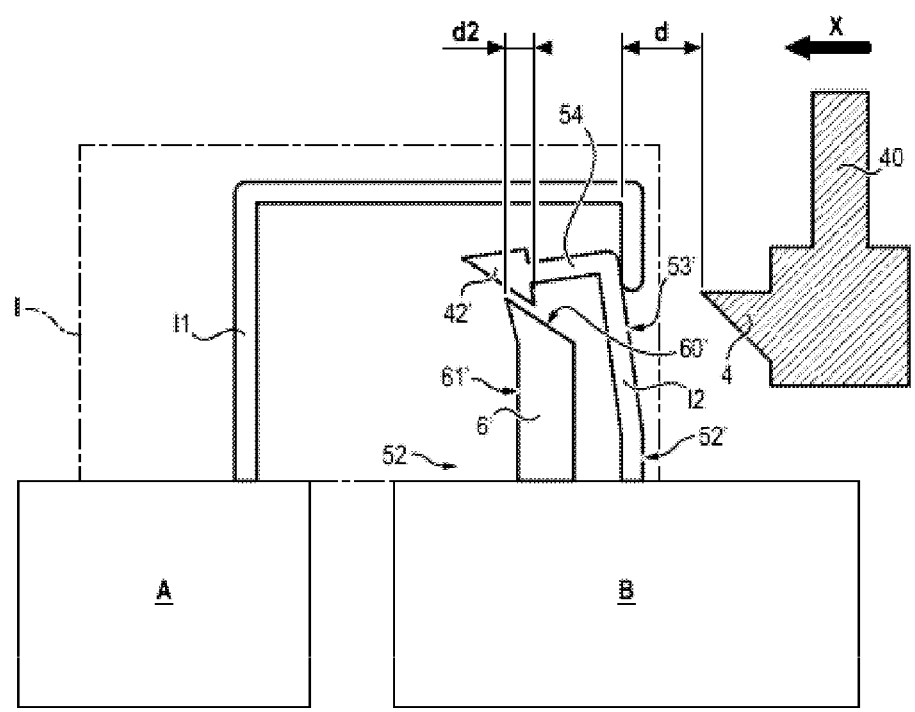
FIG. 3b is a diagram illustrating elements of a deformation sensor according to a third variant.

FIG. 3b represents a deformation sensor according to a third embodiment. The overall architecture of the sensor of this third embodiment is identical to that of the sensor described above in relation to FIG. 3a. The pushing element 4 is configured for the detection of a displacement of the first part along the X direction without a way towards the left relative to the second part. The pushing element 4 remains fixed relative to the first part 2. In the rest position, the junction part I remains fixed relative to the second part 3. In addition, the general structure of the pushing element 4 and the structure of the connection element i1 are similar relative to the second embodiment illustrated in FIG. 3a.

On the other hand, the structure of the deformable element i2, arranged to come into contact with the pushing element 4 in case of a deformation event affecting the sensor, differs from the second embodiment of FIG. 3a.

In this third embodiment, the elements allowing the locking are arranged directly on the deformable element i2 and on the junction part. An abutment 6' is arranged on the opposite side of the deformable element i2 relative to the pushing element 4. Thus, when the pushing element 4 moves along the X direction in the way of measurement, it pushes the deformable element i2 in the direction of the abutment 6'.

In this third embodiment, the sensor therefore does not necessarily comprise an abutment on the opposite side of the pushing element 4 relative to the deformable element i2.

In the example of FIG. 3b, a locking element 42' is arranged directly on the deformable element i2, in the direction of the abutment 6'. Here, the deformable element i2 comprises an arm 54 which extends in the direction of the abutment 6' and which ends with the locking element 42'. The locking element 42' is a triangular tip placed at the end of the arm 54.

Advantageously, the deformable element i2 has a rigidity in the vicinity of the top end 53' which is strictly greater than its rigidity in the vicinity of the bottom end 52', so that the breaking of the electrical connection between the electrodes A and B intervenes as soon as the pushing element 4 comes into mechanical contact with the top end 53' of the deformable element i2.

The locking element 42' is configured to be blocked by the abutment 6', once the pushing element 4 has crossed a sufficient distance along the X direction to move the locking element 42' past the abutment 6'. This sufficient distance is here equal to the sum of the distance d of displacement from which the deformable element i2 switches to the open position under the effect of the load of the pushing element 4, and of an additional distance d2 represented in FIG. 3b. When the abutment blocks the deformable element i2, the latter can no longer move back to the closed position. The electrical connection between the electrodes A and B therefore remains broken. In this variant, it is not necessary to provide another abutment on the second part 3.

In FIG. 3b, the abutment 6' comprises a sliding surface 60' and a blocking surface 61'. The sliding surface 60' is oriented so that the deformable element i2 slides on the sliding surface when it approaches the abutment 6'. Here, the sliding surface 60' has a slope complementary with a slope of the locking element 42'. On the other hand, the blocking surface 61' is oriented so as to block the deformable element i2 (specifically the locking element 42' here) in an open position after the deformable element has crossed the distance d+d2.

The locking of the deformable element i2 has the advantage of forcing the deformable element i2 to remain in the open position even if there is no power supply during the deformation event or if this power supply is cut off before an interrogation of the sensor. The sensor is therefore compatible with an intermittent power supply.

It will be noted that an electronic circuit comprising the deformation sensor of the example of FIG. 3b can advantageously include an unlocking system (not represented here), configured to load the deformable element i2 or the abutment 6' so that the deformable element is no longer blocked by the abutment.

Measurement within the Circuit Integrating the Deformation Sensor

Figure 4:
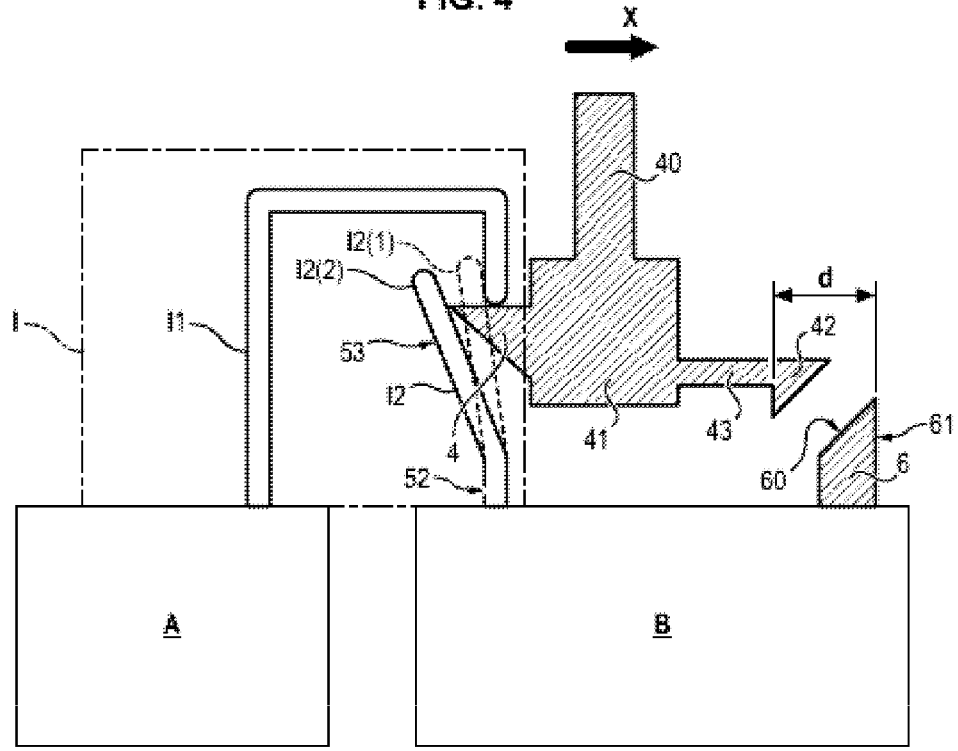
FIG. 4 is a diagram illustrating elements of a deformation sensor according to a fourth variant.

FIG. 4 is an electrical diagram illustrating a measurement in a circuit integrating a deformation sensor according to any one of the preceding examples. Here, an equivalent resistance between the electrodes A and B is measured by means of a voltage measurement. The voltage measuring device described in relation to this FIG. 4 can also be used with the deformation sensor described below in relation to FIG. 5.

As seen previously, a deformation event of the structure carrying the deformation sensor, with a displacement of the first part 2 relative to the second part 3 along the X direction beyond a threshold distance, causes the breaking of the electrical connection between the two electrodes A and B.

In order to convert the breaking of said electrical connection into a signal detectable in real time by a remote processing unit, the circuit here has an electrical voltage measuring device. When the electrical connection between the electrodes A and B is broken, the voltage measured by the voltage measuring device is modified.

The voltage measuring device allows measuring the electric potential at one of the two electrodes, here the electrode B. In this example, the voltage measuring device is a microcontroller 70.

The circuit further comprises a first conductor 71 adapted to be brought to a fixed electric potential. It is here a tip connected to the ground, corresponding to zero potential.

The circuit further comprises a resistance $R_{PD}$ disposed in series with the electrode B, between the first conductor 71 and the electrode B. The resistance $R_{PD}$ has known fixed impedance. The microcontroller 70 provides a measurement of the potential to the terminal of the resistance $R_{PD}$ which is connected to the electrode B.

The circuit further comprises a second conductor 72 connected to the electrode A (which is not connected to the electrode B). The second conductor 72 is brought, during the operation of the circuit, to a non-zero fixed potential Vdd. The potential of the electrode A during operation is therefore very close to the potential Vdd, and said potential is equal to the potential Vdd if it is considered that the conductors are perfect.

The voltage measurement is based on a resistive bridge principle. The electrical connection between the electrodes A and B which passes through the junction part (not represent in FIG. 4) is embodied by an equivalent resistance $R_{eq}$.

Preferably, the impedance of the equivalent resistance $R_{eq}$ has much lower value than the fixed impedance of the resistance $R_{PD}$.

When the electrical connection between A and B is established (for example in a rest position of the sensor, when the junction part is in the closed position), the equivalent resistance $R_{eq}$ corresponds to low impedance. Due to the fact that the impedance of the resistance $R_{eq}$, when the electrical connection between the electrodes A and B is established, has been taken very low compared to the impedance of the resistance $R_{PD}$, the potential of the electrode B is substantially equal to Vdd.

Conversely, when the electrical connection between A and B is broken (for example in a loaded position of the sensor), the equivalent resistance $R_{eq}$ corresponds to very high impedance. The potential of the electrode B is therefore modified upon breaking of the electrical connection and approaches the potential of the conductor 71 at the bottom of FIG. 4.

The potential at the electrode B thus depends on the ratio between the impedance of the resistance $R_{PD}$ (which is known) and the impedance corresponding to the equivalent resistance $R_{eq}$, the latter being modified according to the open or closed state of the electrical connection between the electrodes A and B.

During the operation of the sensor, the voltage measuring device (here the microcontroller 70) is capable of detecting the breaking in the electrical connection, in particular if this voltage measuring device is interrogated by a remote system.

Advantageously, the circuit here comprises a radiofrequency communication module 80, here a UHF (Ultra-High Frequency) circuit, connected to an output of the voltage measuring device. The communication module 80 is also connected to a radiofrequency antenna 81, here a UHF antenna.

Here, the voltage measuring device and the radiofrequency communication module are outside the electronic circuit 1. However, alternatively, these elements can be within the same electronic circuit 1 as the deformation sensor.

Preferably, a communication frequency of the UHF antenna and of the UHF communication module is comprised between 700 and 1,000 Megahertz, and is taken for example equal to 868 Megahertz or equal to 915 Megahertz (ISM bands). The interrogation distance of the sensor is thus compatible with the usual uses of a deformation sensor.

The use of a radiofrequency communication module, for example a UHF module, connected to the voltage measuring device, is advantageous in that it allows communicating in real time to a remote processing unit (such as a processor connected to a radiofrequency receiver), information that a deformation event has been detected by the sensor.

Even in case where the power supply of the electrodes A and B and of the resistance $R_{PD}$ is cut off during a deformation event, the voltage measuring device 70 can be interrogated subsequently, when the power supply is established again. A power supply is then provided to the electrodes A and B, which are brought to different electric potentials, as well as to the resistance $R_{PD}$. The value of the potential measured at the electrode B differs depending on the open or closed position of the junction part.

Pushing Element and Junction Part of the Electrodes According to an Example 3

Figure 5:
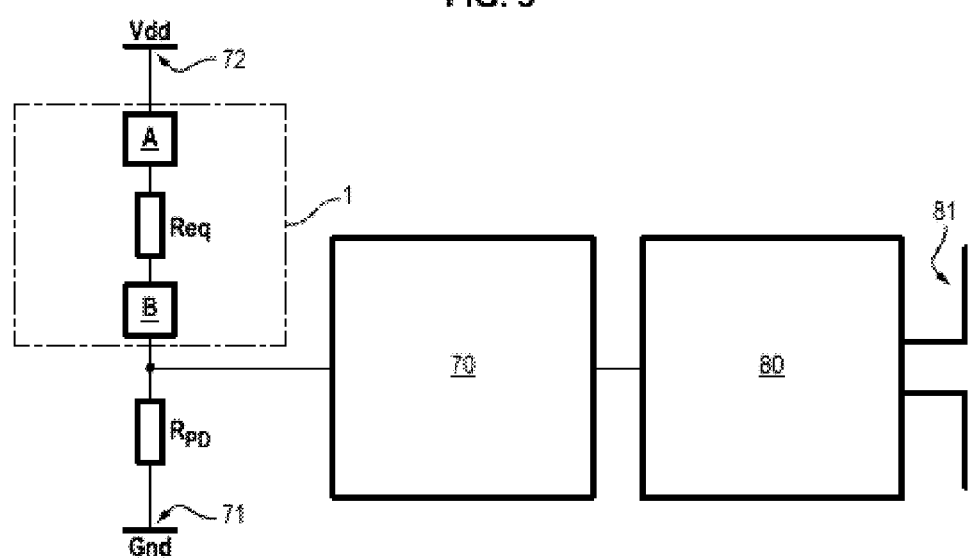
FIG. 5 is a block diagram of a measurement within an electronic circuit comprising a deformation sensor.

FIG. 5 represents some elements of a deformation sensor in accordance with the general architecture above, according to a fourth embodiment.

The overall architecture of the sensor is identical to the foregoing. The pushing element 4 remains fixed relative to the first part 2. In the rest position, the junction part I remains fixed relative to the second part 3. In addition, the general structure of the pushing element 4 and the structure of the connection element i1 are similar compared to the second embodiment illustrated in FIG. 3a and to the third embodiment illustrated in FIG. 3b.

Regarding the deformable element i2, it has a similar shape to that of the second embodiment (and has preferably a flexible bottom end and a rigid top end). In this fourth embodiment, the deformable element i2 can switch between a closed position represented by a dotted line as i2(1) and an open position represented by a solid line as i2(2) in FIG. 5.

Unlike the second embodiment, the pushing element 4 is configured to load the deformable element from the open position towards the closed position, when the first part 2 moves relative to the second part 3 along the X direction of measurement beyond a threshold distance, in one way of measurement.

It will be noted that the way of measurement is here a way of remoteness from the pushing element 4 relative to the junction part I, unlike the embodiments of FIG. 2, FIG. 3a and FIG. 3b. The deformation event measured here therefore corresponds to a displacement of the first part 2 relative to the second part 3 in the way of remoteness.

The open position of the deformable element i2 thus corresponds, in this fourth embodiment, to a rest position of the junction part I, and the closed position of the deformable element i2 corresponds to a loaded position of the junction part I. At rest, the pushing element 4 abuts against the deformable element i2 so as to move it away from the connection element i1. At rest, the deformable element i2 is therefore loaded in its open position.

In other words, at rest, there is no electrical connection passing through the deformable element i2 between the two electrodes A and B. It is the displacement of the pushing element 4 in the way of remoteness, beyond a threshold distance—here the distance along the X direction between the deformable element i2 and the hook of the junction element i1—that leads to the establishment of an electrical contact between the electrodes A and B via the connection element i1 and the deformable element i2. As previously, the threshold distance is preferably comprised between 5 and 500 micrometers, and even more preferably between 10 and 200 micrometers.

As for the second embodiment, the sensor according to the fourth embodiment advantageously comprises a system for locking the deformable element i2. The locking system here allows locking the deformable element i2 in the closed position after a deformation event.

The locking system has a similar function compared to the second embodiment. The abutment 6 authorizes subsequent displacements of the pushing element 4 in the same way as the one corresponding to the detected deformation event (here a way of remoteness from the deformable element i2). However, the locking system prevents the pushing element from moving, after a deformation event, in an opposite way until it again comes into contact with the deformable element i2.

In the example of FIG. 5, the sensor locking system comprises an abutment 6 in the form of a pad, extending from the electrode B towards the pushing element. The abutment 6 comprises a sliding surface 60 allowing the tip 42 to slide on the abutment 6 during a displacement of the pushing element 4 to the right. Unlike the example of FIG. 3a, the blocking surface 61 of the abutment 6 is placed to the right of the abutment. Thus, once the tip 42 has switched to the right of the abutment 6, the blocking surface 61 of the abutment prevents the tip 42 from moving back to the left of the abutment.

After a deformation event causing a displacement of the tip 42 beyond the distance d, the pushing element 4 thus remains out of contact with the deformable element i2. The electrical connection between the electrodes A and B passing through the deformable element i2 and the connection element i1 is maintained.

This mechanical configuration is advantageous because it allows maintaining the electrical connection between the electrodes A and B after a deformation event, without preventing subsequent displacements of the pushing element 4 in a way of remoteness from the deformable element i2.

The cooperation between the pushing element and the abutment therefore ensures, also here, the compatibility of the deformation sensor with an intermittent power supply. A deformation event can be detected even if this event occurs during or after an interruption of the power supply to the sensor.

As for the embodiments described above in relation to FIG. 3a and FIG. 3b, a circuit integrating a deformation sensor in accordance with FIG. 5 can be equipped with an unlocking system (not represented in the Figure). The unlocking system allows releasing, by the load of the pushing element or of the abutment, the pushing element.

An actuator configured to load upwards, on command, the pole 43 or the tip 42 can for example be provided. After actuation, the tip 42 is no longer in contact with the abutment 6, which allows the pushing element 4 to move to the left.

The proposed sensor thus becomes, by means of the unlocking system, a sensor resettable on command.

In the examples of FIGS. 3a, 3b and 5, the unlocking system is for example configured to be activated in response to a reset signal received from a remote device such as a server. For example, the sensor is reset as soon as the remote device has recorded the information that the sensor has detected a deformation event. The reset signal can for example be received by means of the RFID circuit 80. Alternatively or in combination, the unlocking system is configured to reset the sensor at regular intervals.

The invention claimed is:

1. A MEMS type deformation sensor for measuring a relative displacement between two areas of a structure, comprising:
    a first part and a second part movable relative to each other along a direction of measurement,
    a pushing element fixedly mounted relative to the first part,
    a first electrode and a second electrode adapted to be brought to different electric potentials, each electrode being fixedly mounted relative to the second part, and
    a junction part forming an electrical connection between the first electrode and the second electrode,
    wherein the pushing element is configured to exert a load on the junction part (I) when the first part moves relative to the second part along the direction of measurement beyond a predetermined distance, the electrical connection being broken under the effect of the load.

2. The sensor according to claim 1, wherein the pushing element is configured to exert the load on the junction part when the first part moves relative to the second part along a first direction, and not to exert any load on the junction part when the first part moves relative to the second part in a second direction, opposite to the first direction, along the direction of measurement.

3. The sensor according to claim 1, wherein the junction part comprises a first bridge and a second bridge, the first bridge and the second bridge being respectively fixed to the first electrode and to the second electrode, the load of the pushing element on the junction part having the effect of breaking the first bridge and the second bridge.

4. The sensor according to claim 3, wherein the first bridge and the second bridge are formed by thinned portions of the junction part.

5. The sensor according to claim 1, wherein the junction part comprises a deformable element, the deformable element being designed to be deformed between an open configuration and a closed configuration, the junction part electrically linking together the first electrode and the second electrode when the deformable element is in the closed configuration, the pushing element being designed to load the deformable element from the open configuration towards the closed configuration when the first part moves relative to the second part along the direction of measurement.

6. The sensor according to claim 5, wherein the deformable element includes a first end fixed to the second electrode and a second end designed to be moved relative to the second electrode during a deformation of the deformable element.

7. The sensor according to claim 6, wherein the deformable element has a first rigidity in the vicinity of the first end and has a second rigidity in the vicinity of the second end, the first rigidity being strictly lower than the second rigidity.

8. The sensor according to claim 5, the sensor comprising an abutment arranged to authorize a relative displacement of the pushing element in a first direction towards the deformable element until the pushing element loads the deformable element, and to prevent a subsequent displacement of the pushing element in a second direction, opposite to the first direction.

9. The sensor according to claim 8, comprising an arm including a termination, the pushing element comprising a locking element extending from the termination along a direction substantially parallel to the direction of measurement, the locking element being configured to cooperate with the abutment.

10. The sensor according to claim 8, wherein the abutment protrudes from the second electrode towards the pushing element.

11. The sensor according to claim 8, wherein the abutment comprises a sliding surface and a blocking surface, the sliding surface being oriented so that when the pushing element moves in the first direction, towards the deformable element, the pushing element slides on the sliding surface, and the blocking surface being oriented so that when the pushing element subsequently moves in the second direction, opposite to the first direction, while moving away from the deformable element, the pushing element comes into abutment against the blocking surface.

12. The sensor according to claim 1, wherein the second part comprises a silicon-on-insulator type substrate, the first electrode and the second electrode being carried by the SOI type substrate.

13. An electronic circuit comprising:
the deformation sensor according to claim 1,
a conductor configured to be brought to a fixed potential,
a resistance comprising a first terminal and a second terminal, the first terminal being connected to the conductor, the second terminal being connected to the first electrode of the deformation sensor or to the second electrode of the deformation sensor, and
a voltage measuring device, the device being configured to provide a measurement of the potential of the second terminal.

14. The electronic circuit according to claim 13, wherein the junction part of the deformation sensor comprises a deformable element, the deformable element being designed to be deformed between an open configuration and a closed configuration, the junction part electrically linking together the first electrode and the second electrode when the deformable element is in the closed configuration, the pushing element being designed to load the deformable element from the open configuration towards the closed configuration when the first part moves relative to the second part along the axis of measurement.

15. The electronic circuit according to claim 14, wherein the sensor comprises an abutment arranged to authorize a relative displacement of the pushing element in a first direction towards the deformable element until the pushing element loads the deformable element, and to prevent a subsequent displacement of the pushing element in a second direction, opposite to the first direction.

16. The electronic circuit according to claim 15, further comprising an unlocking system which comprises an actuator configured to exert, on command, a force able to push back the pushing element relative to the abutment.

17. The electronic circuit according to claim 16, wherein the force is an electrostatic or magnetic force.

\* \* \* \* \*